United States Patent
Kwong

(10) Patent No.: US 9,807,919 B2
(45) Date of Patent: Oct. 31, 2017

(54) ELECTRONIC DEVICES HAVING ELECTROSTATIC DISCHARGE PATHS

(71) Applicant: Apple Inc., Cupertino, CA (US)

(72) Inventor: Kelvin Kwong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 186 days.

(21) Appl. No.: 14/167,625

(22) Filed: Jan. 29, 2014

(65) Prior Publication Data

US 2015/0216024 A1    Jul. 30, 2015

(51) Int. Cl.
| | |
|---|---|
| H01H 47/00 | (2006.01) |
| H05F 3/00 | (2006.01) |
| H05F 3/02 | (2006.01) |
| H05K 9/00 | (2006.01) |

(52) U.S. Cl.
CPC .................. H05K 9/0067 (2013.01)

(58) Field of Classification Search
CPC ...... H05F 3/02; H05K 5/0247; H05K 5/0017; H05K 9/0094; H05K 9/0067; G02F 1/133308; G03B 15/03
USPC .......................................................... 361/220
See application file for complete search history.

(56) References Cited

U.S. PATENT DOCUMENTS

| | | | | |
|---|---|---|---|---|
| 4,475,975 A | * | 10/1984 | Talley ....................... | B44C 1/10 156/234 |
| 6,819,942 B2 | * | 11/2004 | Aotake ............... | H04M 1/6058 348/E5.029 |
| 7,744,384 B2 | | 6/2010 | Wu | |
| 8,974,435 B2 | * | 3/2015 | Friedli .............. | A61M 5/14244 604/187 |
| 2006/0146226 A1 | | 7/2006 | Hung et al. | |
| 2009/0059502 A1 | * | 3/2009 | Filson ................... | G06F 1/1601 361/679.27 |
| 2009/0233013 A1 | * | 9/2009 | Fu ........................ | H05K 9/0094 428/13 |
| 2011/0111807 A1 | * | 5/2011 | Kido ................. | G02F 1/133308 455/566 |
| 2011/0255250 A1 | * | 10/2011 | Dinh ...................... | G03B 15/03 361/749 |
| 2012/0050938 A1 | | 3/2012 | Dabov et al. | |
| 2012/0176279 A1 | * | 7/2012 | Merz ...................... | H01Q 1/243 343/702 |
| 2013/0329460 A1 | | 12/2013 | Mathew et al. | |

\* cited by examiner

*Primary Examiner* — Thienvu Tran
*Assistant Examiner* — Lucy Thomas
(74) *Attorney, Agent, or Firm* — Treyz Law Group, P.C.; G. Victor Treyz; Joseph F. Guihan

(57) ABSTRACT

An electronic device may have a display and other electrical components that are sensitive to electrostatic charge. A button may pass through an opening in a layer of the display. A metal trim may surround the button. The housing may have an opening with a clear lens surrounded by a metal trim. To prevent damage from electrostatic discharge, an electrostatic discharge path may be formed in the device that includes a metal trim surrounding a component such as a button member or camera lens, metal traces on the inner surface of a display layer or a housing, a grounded metal housing structure, and a spring or other conductive structure that couples the metal traces to the grounded metal housing structure. Displays may be provided with electrostatic discharge paths that route electrostatic charge to grounded metal housing structures.

20 Claims, 8 Drawing Sheets

ELECTRONIC DEVICES HAVING ELECTROSTATIC DISCHARGE PATHS

BACKGROUND

This relates generally to electronic devices, and, more particularly, to structures for discharging electrostatic charge in electronic devices.

Electronic devices include components such as sensors, integrated circuits, and other electrical components. Circuitry in these components can be sensitive to electrostatic charge. Electrostatic discharge events may arise when a user touches a sensitive component or touches a portion of an electronic device housing in which a sensitive component is mounted. If care is not taken, sensitive circuitry can be damaged by electrostatic charge during electrostatic discharge events.

It would therefore be desirable to be able to provide an improved arrangement for protecting sensitive electrical components in an electronic device from damage during electrostatic discharge events.

SUMMARY

An electronic device may have electrical components that are sensitive to electrostatic charge. For example, an electronic device may have a button with a sensor, a camera, and a display that are sensitive to electrostatic charge.

The display and other electrical components may be mounted in a housing. A button may pass through an opening in an outermost layer of the display. A metal trim may surround the button. The housing may have an opening with a clear camera lens surrounded by a metal trim.

To prevent damage from electrostatic discharge, an electrostatic discharge path may be formed in the device. The electrostatic discharge path may include a metal trim surrounding a component such as a button member or camera lens, a patterned metal trace on the inner surface of the outermost display layer or the housing, a grounded metal housing structure, and a spring or other conductive structure that couples the metal trace to the grounded metal housing structure and thereby shorts the metal trim to ground.

Displays may be provided with electrostatic discharge paths that route electrostatic charge to the grounded metal housing structures. For example, a metal trace with the shape of a rectangular ring may surround a rectangular active area in a display. The metal trace may be formed on the innermost surface of the outermost display layer in the display.

DETAILED DESCRIPTION

Electronic devices may be provided with electrical components such as sensors, integrated circuits, light-emitting didoes and other components that emit light, light detectors, cameras, buttons, speakers, microphones, vibrators, tone generators, communications circuitry, and other electrical components. The circuitry of these components may be sensitive to damage from electrostatic charge generated during electrostatic discharge events. For example, an electrical component may be damaged when a user touches an electronic device and discharges static charge from the user's body into an ungrounded portion of the electronic device.

Damage from electrostatic discharge can be avoided by providing conductive electrostatic discharge paths within electronic devices. With this type of arrangement, electrostatic charge from the body of a user may flow safely to ground without damaging sensitive circuitry. In devices with displays, part of an electrostatic discharge path may be provided by conductive traces on part of the display. Electrostatic discharge paths may also be formed on the inner surface of an electronic device housing.

Figure 1:
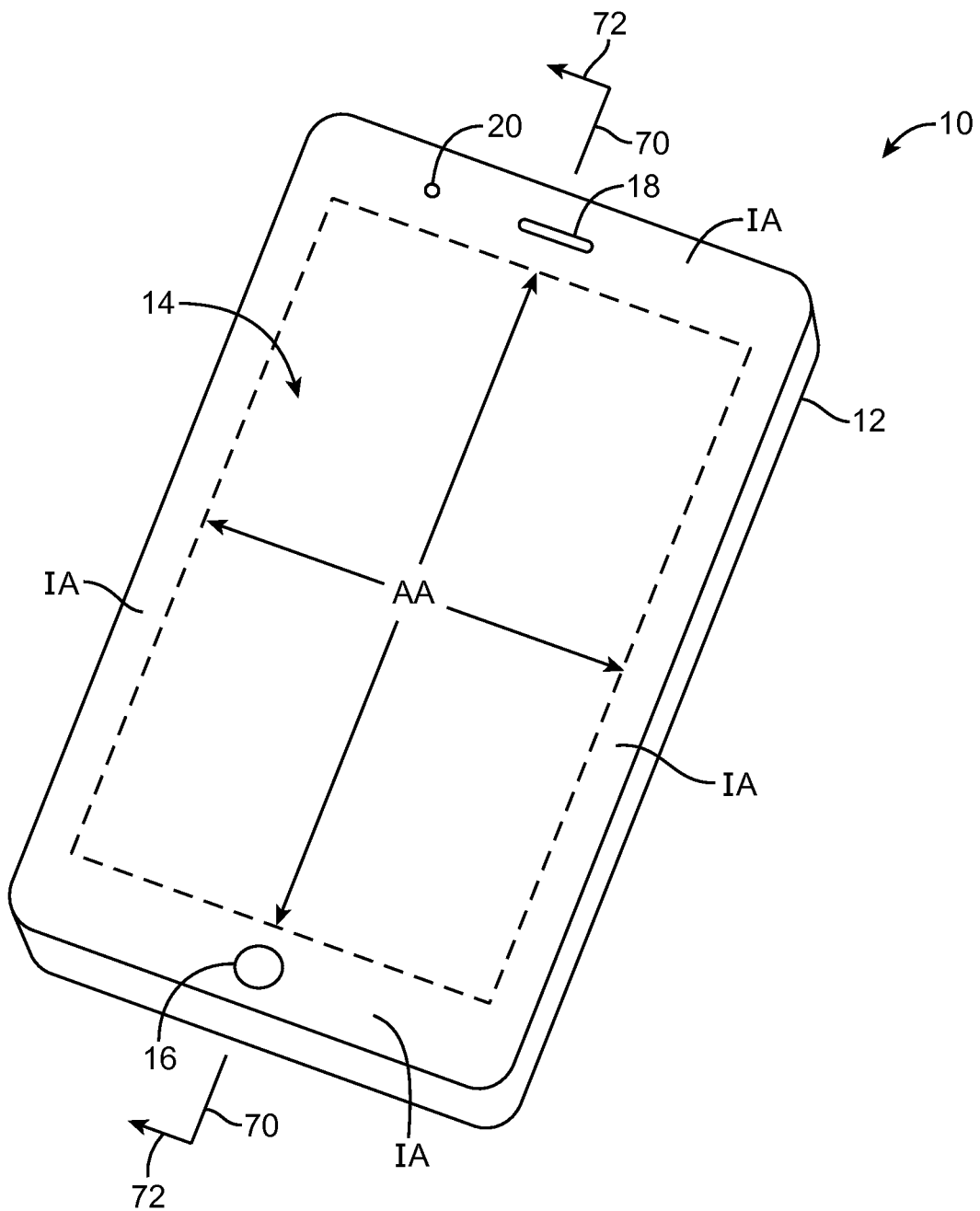
FIG. 1 is a perspective view of an illustrative electronic device such as a handheld computing device of the type that may be provided with an electrostatic discharge protection structure in accordance with an embodiment.

FIG. 1 is a perspective view of an illustrative electronic device of the type that may be provided with an electrostatic discharge path to prevent sensitive electrical components from being damaged during an electrostatic discharge event. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

Device 10 may have one or more displays such as display 14 mounted in housing structures such as housing 12.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable display pixel structures such as organic light-emitting diode display pixels, electrophoretic display pixels, plasma display pixels, etc. The display pixels may be arranged in an array having numerous rows and columns to form rectangular active area AA of FIG. 1. Rectangular active area AA may be located in the center of device 10 and may be surrounded by inactive border regions such as inactive area IA. Inactive area IA may have a rectangular ring shape of the type shown in FIG. 1 or may extend only along a pair of the edges of device 10 (e.g., along the upper and lower edges of device 10 in a configuration in which the left and right edges of device 10 are borderless). Other inactive area shapes may be used, if desired.

A display cover layer may cover the surface of display 14 or a display layer such as a color filter layer (e.g., a layer formed from a clear substrate covered with patterned color filter elements) or other portion of a display may be used as the outermost (or nearly outermost) layer in display 14. In this type of configuration, the color filter layer or other outermost layer may sometimes be referred to as a display cover layer. The outermost display layer may be formed from a transparent glass sheet, a clear plastic layer, or other transparent member.

To hide internal components from view, the underside of the outermost display layer or other display layer surface in inactive area IA may be coated with an opaque masking layer such as a layer of ink (e.g., black or white ink). If desired, openings may be formed in the outermost layer of display 14 (e.g., in inactive area IA) to accommodate components such as button 16. An opening for a speaker port such as speaker port 18 or other openings may also be formed in the outermost layer of display 14. Camera windows such as camera window 20 may be formed in inactive area IA of display 14, on the edges of housing 12, or on the rear of housing 12 (as examples). In general, any suitable electrical components (e.g., buttons, connector ports, audio ports, sensors, other components, etc.) may be accommodated using openings in housing 12 and/or display 14. The example of FIG. 1 is merely illustrative.

Figure 2:
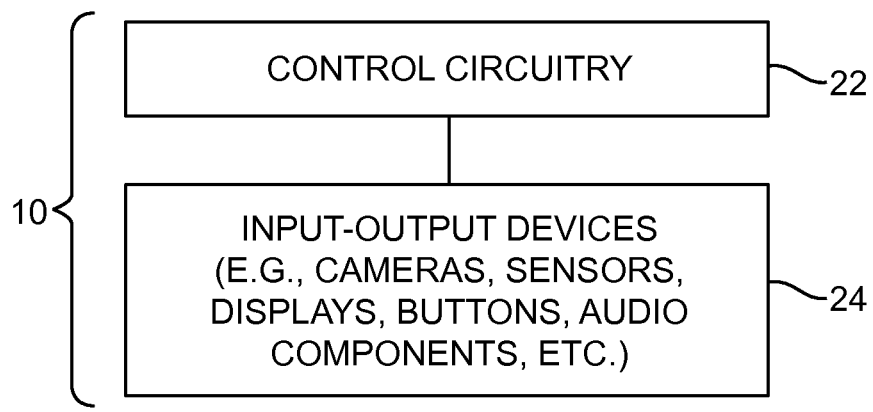
FIG. 2 is a schematic diagram of an illustrative electronic device in accordance with an embodiment.

A schematic diagram of an illustrative configuration that may be used for electronic device 10 is shown in FIG. 2. As shown in FIG. 2, electronic device 10 may include control circuitry 22. Control circuitry 22 may include storage and processing circuitry for controlling the operation of device 10. Control circuitry 22 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 22 may include processing circuitry based on one or more microprocessors, microcontrollers, digital signal processors, baseband processors, power management units, audio codec chips, application specific integrated circuits, etc.

Input-output devices 24 may be used to allow data to be supplied to device 10 and to allow data to be provided from device 10 to external devices. Input-output devices 24 may also include input-output components with which a user can control the operation of device 10. A user may, for example, supply commands through input-output devices 24 and may receive status information and other output from device 10 using the output resources of input-output devices 24.

Input-output devices 24 may include sensors and status indicators such as an ambient light sensor, a proximity sensor, a temperature sensor, a pressure sensor, a magnetic sensor, an accelerometer, a touch sensor, a fingerprint sensor, and light-emitting diodes and other components for gathering information about the environment in which device 10 is operating and providing information to a user of device 10 about the status of device 10. Audio components in devices 24 may include speakers and tone generators for presenting sound to a user of device 10 and microphones for gathering user audio input. Devices 24 may include one or more displays. Displays may be used to present images for a user such as text, video, and still images. Sensors in devices 24 may include a touch sensor array that is formed as one of the layers in display 14. During operation, user input may be gathered using buttons and other input-output components in devices 24 such as touch pad sensors, buttons, joysticks, click wheels, scrolling wheels, touch sensors such as a touch sensor array in a touch screen display or a touch pad, key pads, keyboards, vibrators, cameras, and other input-output components. The input-output devices of device 10 may include wired and wireless communications circuitry (e.g., circuitry to support digital data communications, a radio-frequency transceiver and antennas for supporting wireless communications, etc.).

Figure 3:
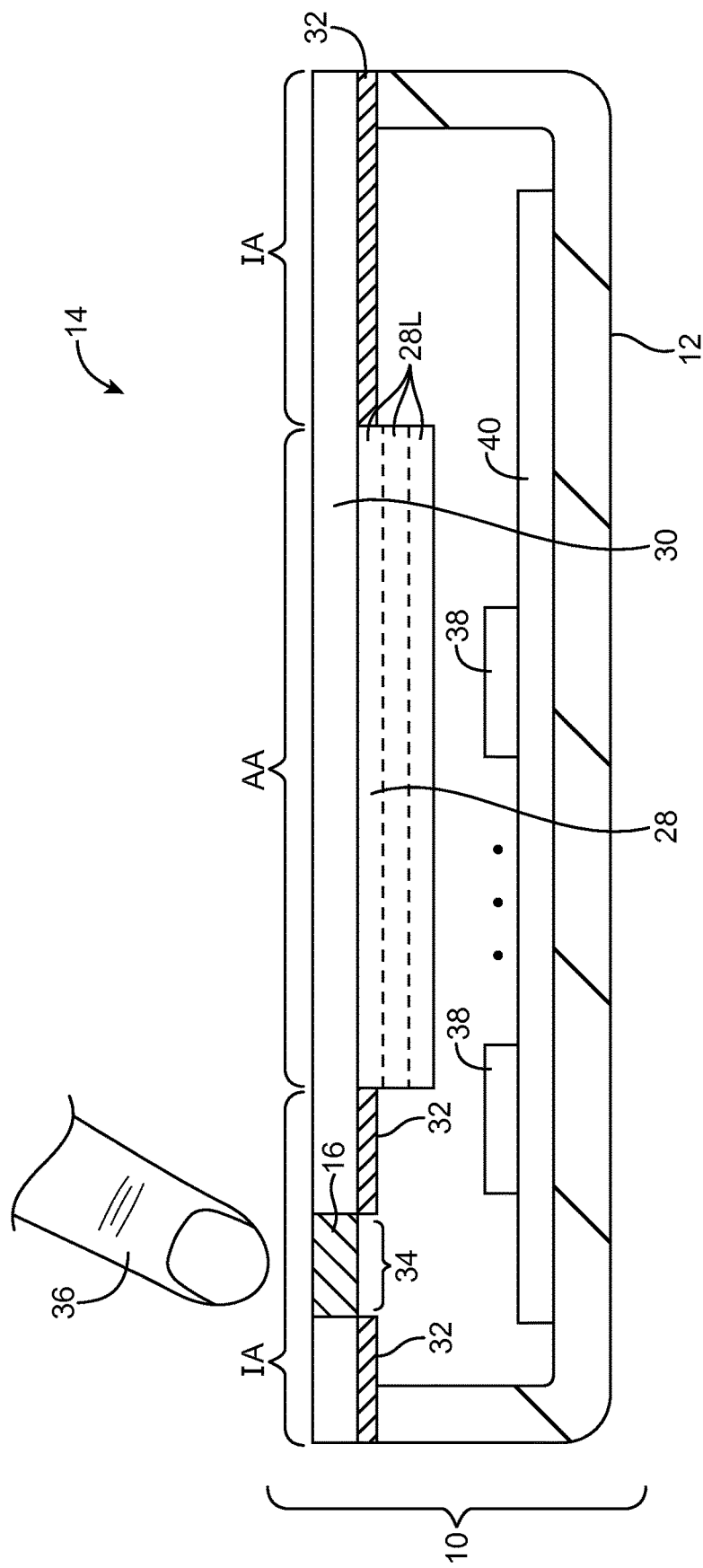
FIG. 3 is a cross-sectional side view of an electronic device having electrical components and an electrostatic discharge protection structure for protecting the electronic components from damage during electrostatic discharge events in accordance with an embodiment.

A cross-sectional side view of an illustrative electronic device such as electronic device 10 of FIG. 1 taken along line 70 and viewed in direction 72 is shown in FIG. 3. As shown in FIG. 3, display 14 may be mounted within housing 12. Display 13 may include display layers 28L and an outermost display layer such as display cover layer 30. Display layers 28L may include organic light-emitting diode structures, liquid crystal display structures, or other display structures. As an example, in a liquid crystal display configuration, display layers 28L may include upper and lower polarizer layers, a color filter layer and thin-film transistor layer between the polarizer layers, and a layer of liquid crystal material between the color filter layer and the thin-film transistor layer.

Display layers 28L, which may sometimes be referred to as forming a display, display module, or display structure, include an array of display pixels. The display pixels overlap rectangular active area AA and are used in displaying images for a user of device 10 in active area AA. Inactive area IA does not contain display pixels and does not produce images for a user. To hide internal device structures from view, the inner surface (i.e., the underside) of display cover layer 30 may be coated with an opaque masking layer such as opaque masking layer 32 in inactive area IA. Opaque masking layer 32 may be formed from a layer of ink (e.g., black ink, white ink, ink with other colors) or other opaque material.

Device 10 may include a button such as button 16. A user may press button 16 (e.g., using finger 36 or other external object). Button 16 may have a movable button member that moves within opening 34 in display cover layer 30.

Device 10 may also contain other electrical components such as electrical components 38 (e.g., input output devices 24 and control circuitry 22 of FIG. 2). Electrical components 38 may be interconnected using wires, cables, flexible printed circuit cables, interconnects on printed circuit board, and other conductive paths. As shown in FIG. 3, for example, electrical components 38 may be mounted on a substrate such as printed circuit 40. Printed circuit 40 may be a rigid printed circuit board (e.g., a printed circuit board formed from fiberglass-filled epoxy or other rigid printed circuit board material) or may be a flexible printed circuit (e.g., a flex circuit formed from a layer of polyimide or a sheet of other flexible polymer). Metal traces on printed circuit 40 may form interconnects that interconnect the circuitry of components 38.

Electrical components 38 may include integrated circuits, sensors, switches, cameras and other light-based components, speakers, microphones, and other audio components, communications circuitry, processing circuitry, storage circuits, etc. Electrical components 38 may have conductive contacts (terminals) that can be electrically connected to mating contact pads on printed circuits such as printed circuit 40. The contact pads on the printed circuit may be formed from patterned metal traces. Conductive adhesive, solder, or other conductive connections may be used in mounting the electrical components to the contacts on the printed circuit.

External objects such as user's finger 36 may carry electrostatic charge. When a user's finger touches a part of device 10 such as button 16 or other portion of device 10, sensitive circuitry in device 10 may potentially be exposed to the electrostatic charge. To prevent damage to sensitive electrical components in device 10 such as button 16 and other electrical components 38, device 10 can be provided with electrostatic discharge paths. As an example, conductive traces can be formed on substrates such as display cover layer 30. A conductive trace may be formed from a metal, a conductive material such as indium tin oxide, or other conductive material. A conductive path that is formed at least partly from a conductive trace on display cover layer 30 (e.g., on the inner surface of display cover layer 30 in inactive area IA) may be used to safely discharge electrostatic charge from a user's finger or other source to ground.

Figure 4:
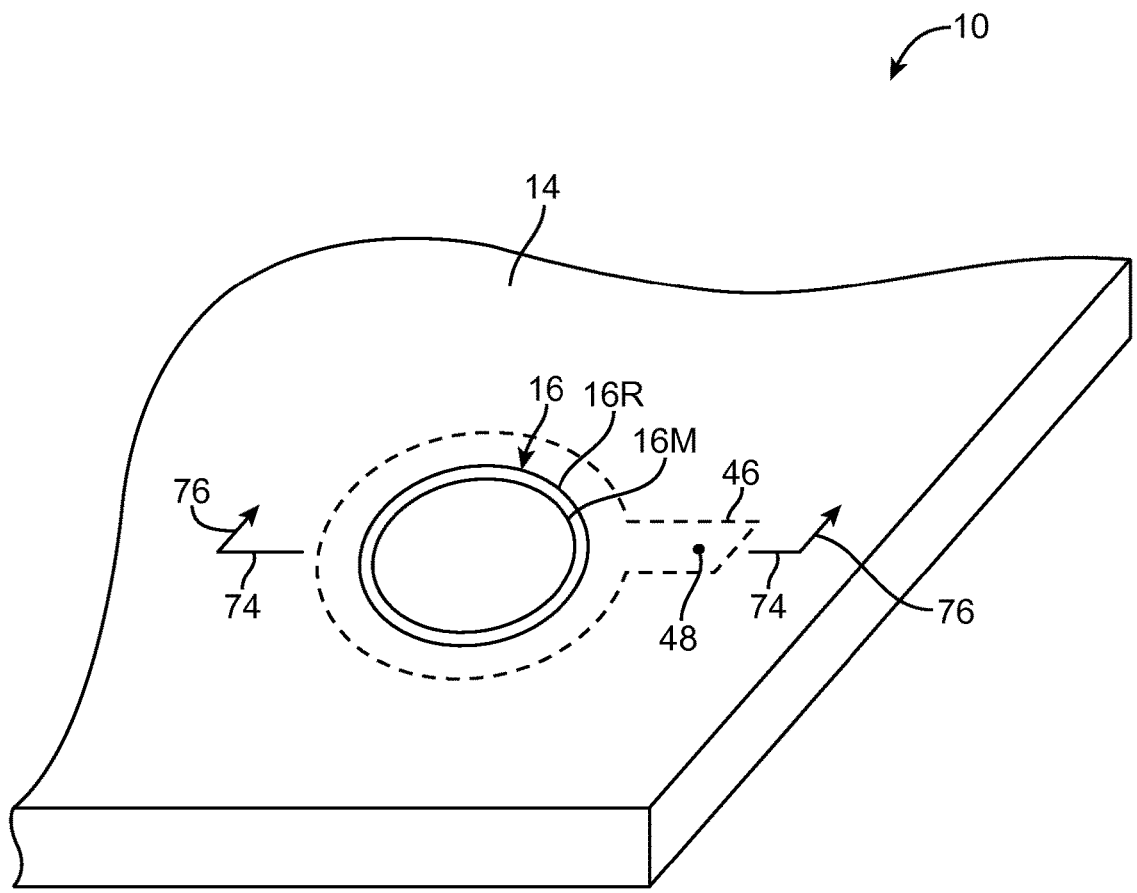
FIG. 4 is a perspective view of an illustrative electronic device with an electrostatic discharge path formed on the underside of a display layer in accordance with an embodiment.

FIG. 4 is a perspective view of a portion of electronic device 10 in the vicinity of button 16. In the illustrative configuration of FIG. 4, button 16 has a dielectric button member such as button member 16M and a metal trim member such as metal trim 16R. Button 16 may, in general, have any suitable footprint (e.g., a rectangular outline, a shape with curved and straight sides, etc.). The arrangement of FIG. 4 in which button member 16M has a circular outline and in which metal trim 16R has the shape of a circular ring that surrounds button member 16M is merely illustrative.

When a user's finger presses against button 16 during use of device 10, electrostatic charge can be deposited on metal structures such as metal trim 16R. To protect button 16 and other sensitive circuitry in device 10 from damage due to the electrostatic charge, an electrostatic discharge path may be formed in device 10. The electrostatic discharge path may include metal traces, metal spring structures, and other conductive path structures that ground metal trim 16R to a source of ground potential. With the illustrative arrangement of FIG. 4, the underside of display 14 (i.e., the underside of display cover layer 30 in inactive area IA of display 14) has been provided with a patterned conductive layer such as layer 46 (e.g., a metal trace formed from a patterned metal layer deposited using physical vapor deposition, a metal trace formed from metal paint such as pad-printed or screen-printed metal paint, or other conductive trace).

Layer 46 may have a portion with a ring shape that surrounds button 16 and a portion that forms a contact such as contact 48. If desired, layer 46 may be formed from a metal trace with other shapes (e.g., elongated lines, rings, etc.). The example of FIG. 4 is illustrative.

As shown in FIG. 4, portion 48 of conductive layer may be coupled to a spring or other structure that is shorted to ground. With this arrangement, metal ring 16R is shorted to conductive layer 46 on display 14 and a spring or other conductive structure in device 10 couples layer 46 to ground. The ground may be associated with a metal portion of device 10 such as a metal housing midplate (i.e., a sheet metal member or other planar metal member) that serves as an internal support structure for the housing of device 10, may be associated with metal housing walls, or may be associated with other grounded metal housing structures.

During operation, a user's finger is used to press against button 16 to operate button 16. Part of the user's finger bears against dielectric button member 16M and causes button 16 to press against internal button structures such as a dome switch or other electrical switching structures. Another part of the user's finger touches metal trim 16R. Upon contact between the user's finger and metal trim 16R, electrostatic charge from the user's finger is safely discharged to ground through the electrostatic discharge path formed from trim 16R, metal trace 46, the spring contacted to portion 48 of trace 46, and other conductive electrostatic discharge path structures in device 10.

Figure 5:
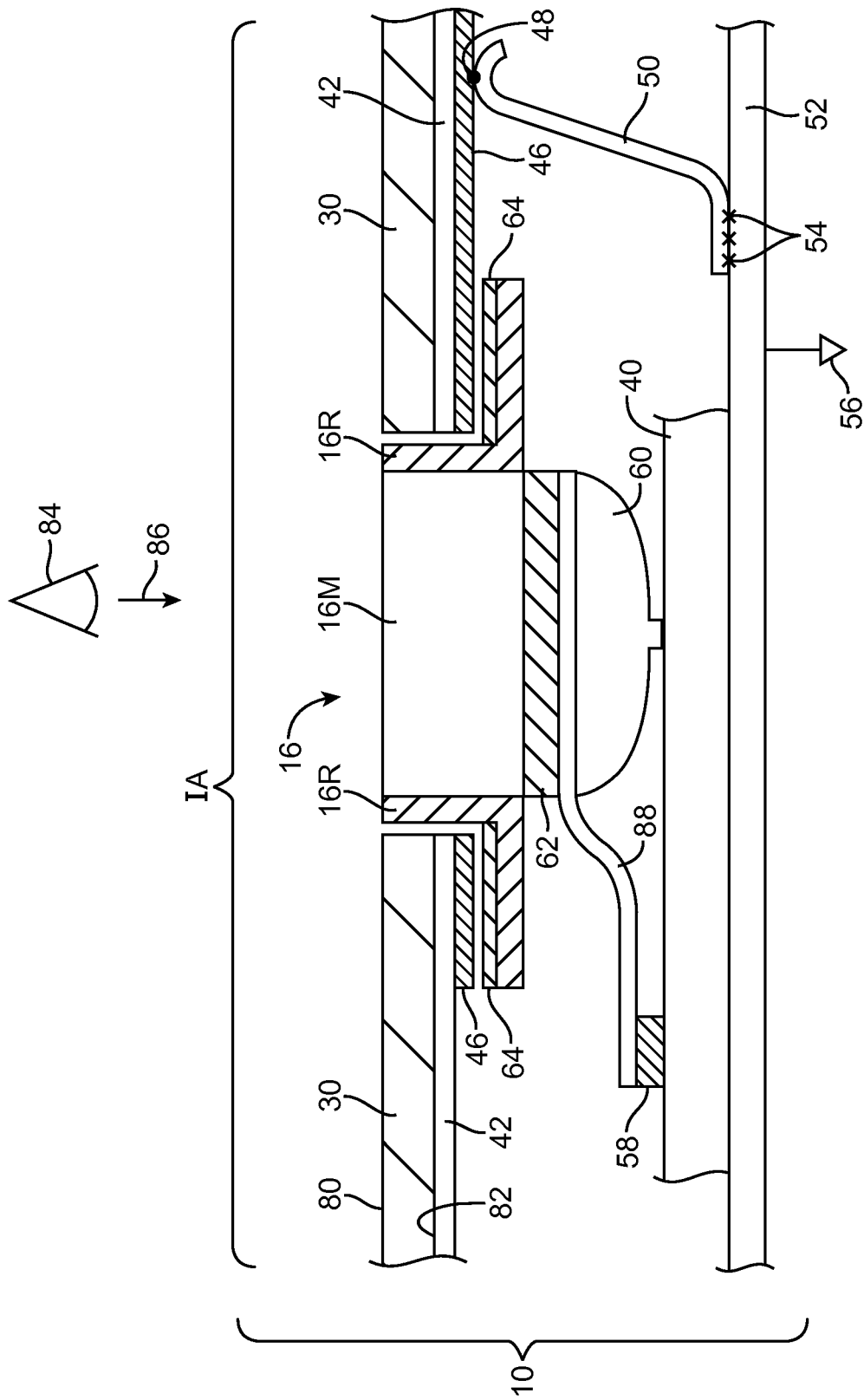
FIG. 5 is a cross-sectional side view of an electronic device having a button with a metal trim and having a conductive layer on the underside of a display layer that forms part of an electrostatic discharge path in accordance with an embodiment.

FIG. 5 is a cross-sectional side view of device 10 of FIG. 4 taken along line 74 and viewed in direction 76 of FIG. 4. As shown in FIG. 5, metal structure 52 is grounded (see, e.g., ground 56). Grounded metal structure 52 may be a metal trace on a printed circuit, may be a portion of a housing wall, or may be an internal housing structure. As an example, metal structure 52 may be a planar internal housing structure such as a piece of stamped sheet metal or other metal plate. The metal plate may be formed within the middle of device 10, may be welded to metal housing walls, and may sometimes be referred to as a housing reinforcement plate or housing midplate.

During operation of device 10, electrostatic charge can be safely discharged to ground (i.e., to grounded metal structures such as structure 52) via an electrostatic discharge path. The electrostatic discharge path in the illustrative arrangement of FIG. 5 includes metal trim 16R, a patterned conductive layer such as metal trace 46 on display cover layer 30, and metal spring 50. If desired, other metal structures may be interposed in the electrostatic discharge path (e.g., wires, metal housing structures, metal traces on one or more substrates in device 10 such as printed circuit board substrates, etc.). Metal structures such as spring 50 may also be implemented using spring-loaded pins, conductive foam, a conductive fabric gasket, or other conductive structures. The configuration of FIG. 5 is merely illustrative.

As shown in FIG. 5, button 16 may have metal trim 16R. Metal trim 16R may have a ring shape and may be formed around the outer edge of a circular button member such as button member 16M. Button member 16M may be formed from a dielectric such as plastic, glass, ceramic, other dielectric materials, or two or more dielectric materials. Display cover layer may have opposing inner (lower) and outer (upper) surfaces such as inner surface 82 and outer surface 80. In inactive area IA of display 14, display cover layer 30 may be provided with an opaque masking layer such as opaque masking layer 42 on inner surface 82. Conductive trace 46 may be patterned on opaque masking layer 42, so that conductive trace 46 is not visible to user 84 viewing device 10 in direction 86.

Button 16 may have a switch such as dome switch 60. Dome switch 60 may have open and closed states. As an example, dome switch 60 may be open when button member 16M is not being depressed by a user and may be closed when button member 16M has been moved downwards in direction 86 when pressed by a user. Dome switch 60 may bear against a structure such as printed circuit 40 or other structure within device 10. Dome switch 60 may be soldered to a substrate such as flexible printed circuit 88, which is connected to printed circuit 40 by connector 58. Switch 60 may bias member 16M upwards when not in use and may be compressed downwards when button 16M is moved downwards by a user.

If desired, button 16 may contain additional circuitry such as sensor circuitry 62. Sensor circuitry 62 may be mounted to the underside of button member 16M and may be electrically connected to metal traces in flexible printed circuit 88. Sensor circuitry 62 may be a fingerprint sensor, a touch sensor, a strain gauge sensor, a force sensor, a proximity sensor, or other suitable sensor.

Sensor 62 and other circuitry associated with button 16 such as dome switch 60 may be sensitive to electrostatic charge. To prevent damage to sensor 62, dome switch 60, and other electrical components 38 in device 10, an electrostatic discharge path is provided between metal trim 16R and grounded structure 52. When button 16 is in its unde-pressed state, trim member 16R presses against conductive trace 46 and is shorted to conductive trace 46. To help reduce contact resistance between trim member 16R and conductive trace 46, trim member 16R and/or conductive trace 46 can be provided with a coating such as illustrative coating 64. Trace 46 may be formed from a metal such as silver, nickel, zinc, aluminum, or copper (as examples) or may be formed form a conductive material such as indium tin oxide or other conductive material. Coating 64 may be, for example, a layer of gold or other metal that has a low resistance (i.e., a high conductivity) and does not readily form a native oxide. Trim 16R may be formed from a metal such as stainless steel or other metal.

Spring 50 or other conductive biasing structure for contacting trace 46 may be formed from a conductive material such as metal. Spring 50 may be coupled to metal structure 52. As shown in FIG. 5, for example, spring 50 may be attached to metal structure 52 using conductive connections 54. Conductive connections 54 may be welds, solder joints, conductive adhesive connections, screws or other fasteners, or other suitable electrical and/or mechanical coupling structures. Spring 50 may form an electrical contact with conductive trace 46 at contact point 48. This forms an electrostatic discharge path from trim 16R, through layers 64 and 46, and through spring 50 to metal structure 52.

Initially, when button 16 is not depressed, trim 16R is shorted to conductive layer 46. When a user desires to press button 16, the user's finger will contact metal trim 16R. As soon as electrical contact is established between the user's finger and metal trim 16R (i.e., before button 16 has actually been moved in a downwards direction), electrostatic charge from the user's finger will flow through the electrostatic discharge path made up of trim 16R, trace 46, and spring 50 to grounded metal structure 52 or other ground. As the user continues to press against button 16, button member 16M will move downwards in direction 86. This will disconnect trim 16R from layer 46 temporarily, but because the electrostatic charge from the user's finger has already been discharged through the electrostatic discharge path that was initially present, sensitive circuitry in device 10 such as sensor 62, switch 60, and electrical components 38 will be protected from electrostatic discharge damage.

Figure 6:
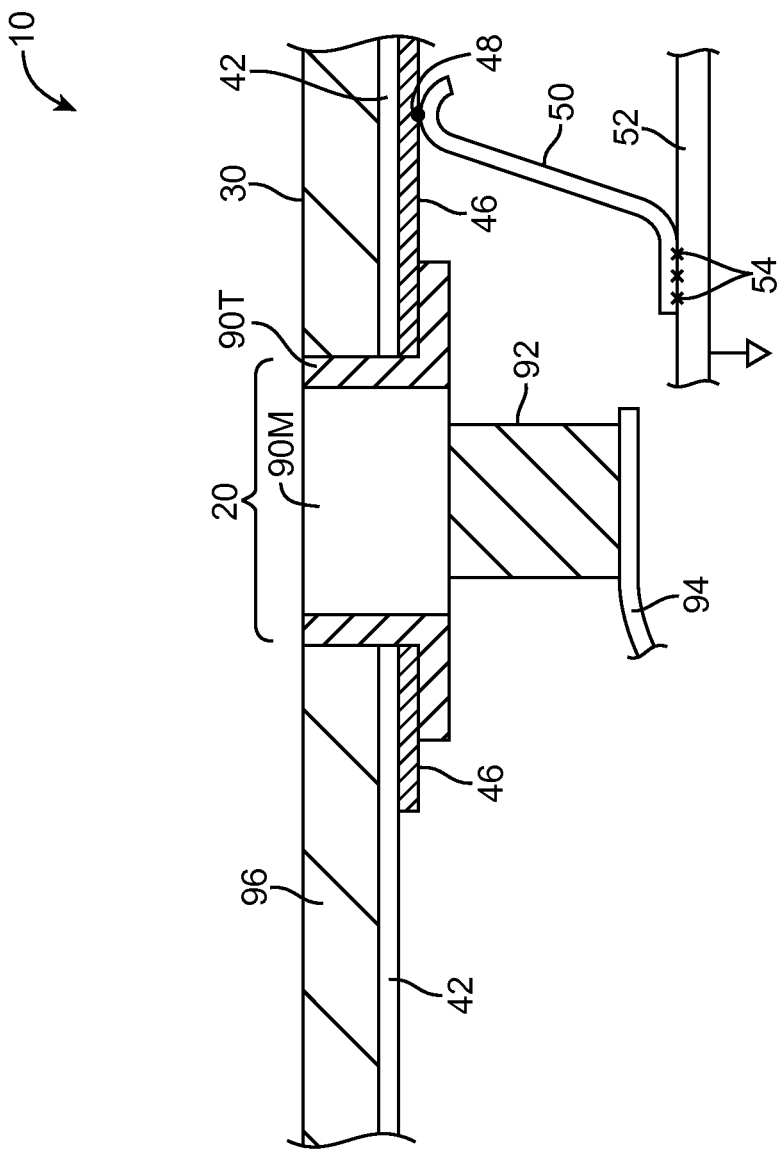
FIG. 6 is a cross-sectional side view of a portion of an electronic device in which an electronic component is mounted under a housing or display layer with a lens surrounded by a metal trim and in which an electrostatic discharge path is formed in accordance with an embodiment.

In the example of FIG. 5, sensitive circuitry associated with a button such as button-mounted sensor 62 is being protected from electrostatic charge. If desired, other types of circuitry in device 10 may be protected using an electrostatic discharge path that is formed using conductive layer 46. Consider, as an example, the arrangement of FIG. 6. As shown in FIG. 6, a sensitive electrical component such as camera 92 (e.g., a digital image sensor) may be mounted under camera window 20. Camera window 20 may include a clear window member such as transparent member 90M. Member 90M, which may sometimes be referred to as a lens or window, may be a transparent disk formed from glass or plastic (as an example). Window member 90M may be surrounded by a metal structure such as metal trim 90T. Window 20 may be formed from an opening in layer 96. Layer 96 may be opaque or clear. In configurations in which layer 96 is clear, the underside of layer 96 may, if desired, be covered with an opaque masking layer such as layer 42. Layer 96 may be a display layer (e.g., display cover layer 30), may be a wall in housing 12 (e.g., a plastic housing wall or other housing structure), or other layer in device 10.

Camera 92 may receive light associated with images through window member 90M. Camera 92 may digitize the incoming light and may provide corresponding digital image data to processing circuitry 22 via signal paths in flexible printed circuit 94. To protect sensitive circuitry such as camera 92 from electrostatic charge, a conductive electrostatic discharge path to ground may be formed in device 10. As shown in FIG. 6, for example, grounded metal structures 52 may be connected to spring 50 or other conductive biasing structure using connections 54 (e.g., solder, welds, conductive adhesive, fasteners, etc.). Spring 50 may bear against patterned conductive trace 46 at contact point 48. With this arrangement, a user's finger that touches metal trim 90T is shorted to ground (i.e., grounded structures 52) via an electrostatic discharge path formed using trim 90T, conductive trace 46, spring 50 (or other conductive path structure), and metal structures 52 (which form ground in this example).

If desired, conductive layer 46 may be patterned to form an electrostatic discharge path that surrounds a display. As shown in the top view of display 14 of FIG. 7, for example, device 10 may have a display with a rectangular active area AA (defined by border 100). Active area AA may be surrounded by a rectangular ring-shaped inactive area IA. Display layers 28L (FIG. 3) may be formed in active area AA. To ensure that electrostatic charge does not damage the circuitry of display layers 28L or other sensitive circuitry in device 10, display 14 may be provided with an electrostatic discharge path. The electrostatic discharge path may include a patterned conductive layer such as patterned conductive layer 46 on the underside of display cover layer 30. Conductive layer 46 may form a ring that surrounds active area AA. Conductive layer 46 may, if desired, have contact regions formed from protrusions 46P that protrude outwardly from rectangular ring-shaped conductive layer 46. Springs or other conductive structures may contact one or more of protrusions 46P to short conductive layer 46 to ground (see, e.g., spring contact point 48).

Figure 7:
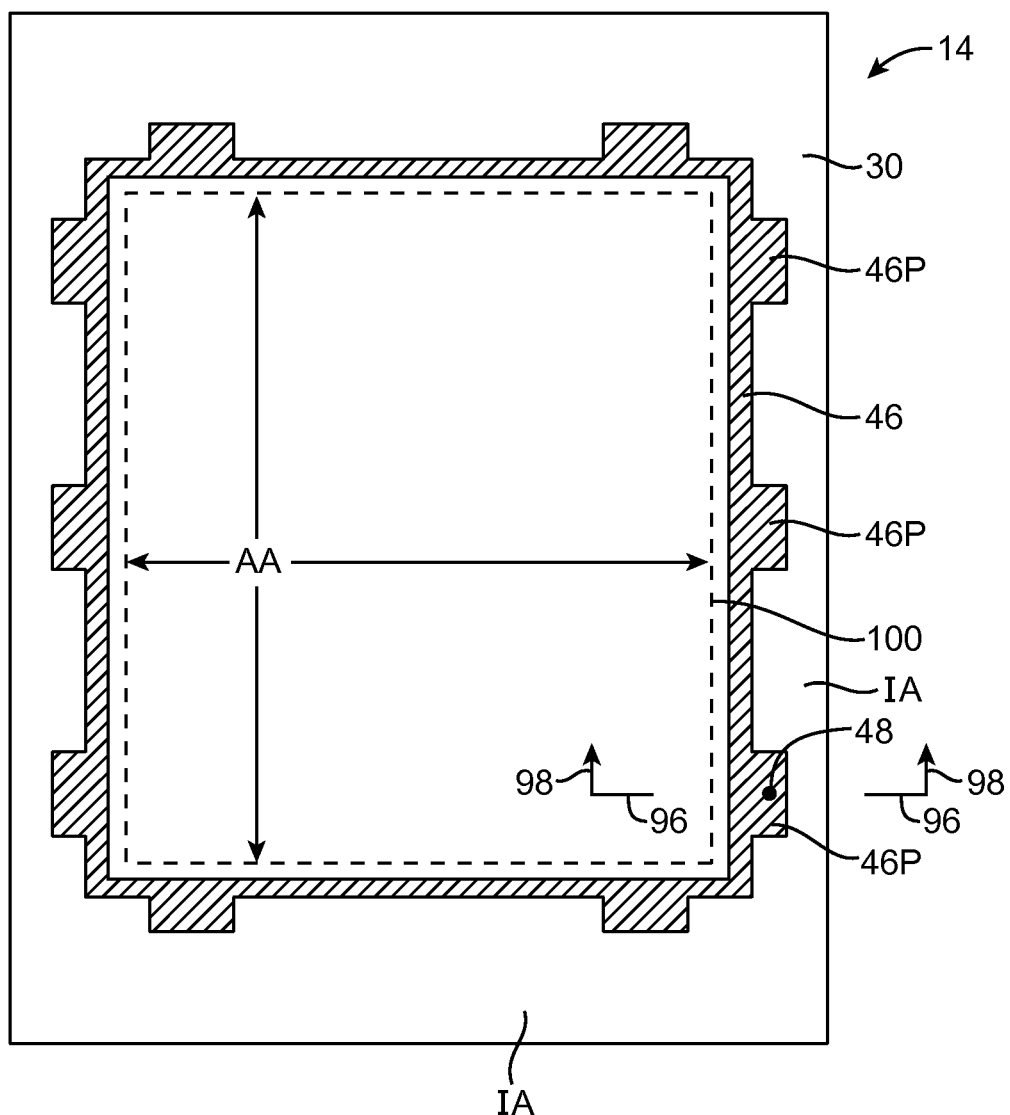
FIG. 7 is a top view of a display cover layer having a ring of conductive material that surrounds an active area of a display and serves as an electrostatic discharge path in accordance with an embodiment.
Figure 8:
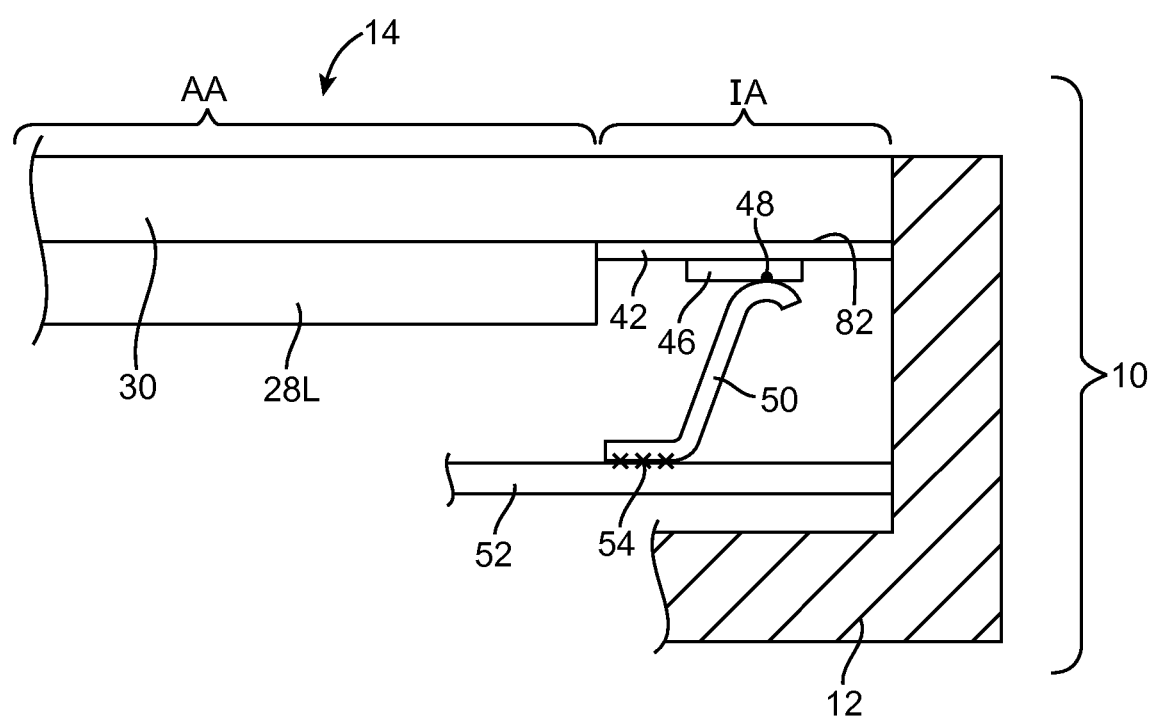
FIG. 8 is a cross-sectional side view of a portion of an electronic device in which an electrostatic discharge path on the underside of a display cover layer has been shorted to a ground formed from a metal housing structure in accordance with an embodiment.

FIG. 8 is a cross-sectional side view of the structures of FIG. 7 taken along line 96 and viewed in direction 98. As shown in FIG. 8, inner surface 82 of display cover layer 30 may be coated with opaque masking layer 42 in inactive area IA to hide internal components in device 10 from view. Conductive layer 46 may be patterned on the inner surface of opaque masking layer 42. Metal spring 50 or other conductive structure may contact layer 46 at a location such as contact location 48, thereby shorting conductive layer 46 to spring 50. Spring 50 is connected to metal structure 52, which is grounded. Connections 54 such as welds, solder connections, connections formed from conductive adhesive, and/or connections formed using fasteners may be used to connect spring 50 to metal structure 52. If desired, metal structures such as metal structure 52 of FIG. 8 and metal structure 52 of FIGS. 5 and 6 may be welded or otherwise coupled to housing 12 (e.g., a metal housing) to provide further grounding. The configuration of FIG. 8 forms an electrostatic discharge path to ground that includes conductive trace 46, spring 50, metal structure 52 and/or metal housing 12, thereby helping to discharge electrostatic charge to ground that is imparted to display 14 in the vicinity of conductive layer 46 from a user's finger or other external object in contact with device 10.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a housing;
a display mounted in the housing, wherein the display includes an outermost display layer, wherein the display has an active area in which images are displayed, wherein the display has an inactive area that surrounds the active area, wherein the outermost display layer has first and second surfaces, and wherein the outermost display layer has an opening that extends from the first surface to the second surface;
a grounded metal structure in the housing;
an electrostatic discharge path that includes a conductive trace on the outermost display layer, that includes the grounded metal structure, and that includes a conductive structure coupled between the conductive trace and the grounded metal structure that shorts the conductive trace to the grounded metal structure; and
a metal trim structure formed in the opening in the outermost display layer, wherein the electrostatic discharge path also includes the metal trim structure, and wherein the conductive structure shorts the metal trim structure to the grounded metal structure.

2. The electronic device defined in claim 1, wherein the conductive structure comprises a metal spring that forms part of the electrostatic discharge path.

3. The electronic device defined in claim 2, wherein the grounded metal structure comprises a sheet metal member.

4. The electronic device defined in claim 3, further comprising a button member, wherein the metal trim structure surrounds the button member.

5. The electronic device defined in claim 4, wherein the outermost display layer comprises a display cover layer and wherein the button member and metal trim structure move within the opening.

6. The electronic device defined in claim 1, wherein the outermost display layer comprises a glass display cover layer and wherein the conductive trace comprises a metal trace on the glass display cover layer.

7. The electronic device defined in claim 1, further comprising a button member, wherein the button member and metal trim structure move within the opening.

8. The electronic device defined in claim 7, further comprising a sensor mounted to the button member and an opaque masking layer on an inner surface of the outermost display layer in the inactive area, wherein the conductive trace comprises a metal trace on the opaque masking layer.

9. The electronic device defined in claim 8, wherein a portion of the metal trace forms a ring that surrounds the button member.

10. The electronic device defined in claim 1, wherein the active area is a rectangular active area and wherein the electrostatic discharge path has a rectangular ring shape that surrounds the rectangular active area.

11. The electronic device defined in claim 1, wherein the conductive trace on the outermost display layer surrounds the active area.

12. The electronic device defined in claim 1, wherein the metal trim structure directly contacts the conductive trace.

13. The electronic device defined in claim 1, wherein the outermost display layer comprises a display cover layer, and wherein the active area in which the images are displayed is visible through the display cover layer.

14. The electronic device defined in claim 1, further comprising a coating formed on the metal trim structure, wherein the coating is formed from metal, and wherein the coating directly contacts the conductive trace.

15. The electronic device defined in claim 1, wherein the conductive trace on the outermost display layer forms a ring that surrounds the active area, wherein the conductive trace has a contact region that protrudes outwardly from the ring, and wherein the conductive structure contacts the contact region to short the conductive trace to the grounded metal structure.

16. The electronic device defined in claim 1, wherein at least a portion of the metal trim structure is interposed between the first and second surfaces of the outermost display layer.

17. An electronic device, comprising:
a housing;
a display mounted in the housing, wherein the display includes an outermost display layer, wherein the display has an active area in which images are displayed, wherein the display has an inactive area that surrounds the active area, wherein the outermost display layer has first and second surfaces, and wherein the outermost display layer has an opening that extends from the first surface to the second surface;
a grounded metal structure in the housing;
an electrostatic discharge path that includes a conductive trace on the outermost display layer, that includes the grounded metal structure, and that includes a conductive structure coupled between the conductive trace and the grounded metal structure that shorts the conductive trace to the grounded metal structure;
a metal trim structure in the opening in the outermost display layer, wherein the electrostatic discharge path also includes the metal trim structure, and wherein the conductive structure shorts the metal trim structure to the grounded metal structure; and
a clear lens in the metal trim structure.

18. The electronic device defined in claim 17, wherein the electrostatic discharge path includes a metal trace on the housing.

19. The electronic device defined in claim 18, further comprising a camera that receives light through the clear lens in the metal trim structure.

20. The electronic device defined in claim 19, wherein the active area in which the images are displayed is visible through the outermost display layer.

* * * * *